United States Patent [19]

Bradford et al.

[11] Patent Number: 5,122,694
[45] Date of Patent: Jun. 16, 1992

[54] METHOD AND ELECTRICAL CIRCUIT FOR ELIMINATING TIME JITTER CAUSED BY METASTABLE CONDITIONS IN ASYNCHRONOUS LOGIC CIRCUITS

[75] Inventors: Jeffrey O. Bradford, Portland, Oreg.; Richard W. Spehn, San Diego, Calif.

[73] Assignee: Tektronix, Inc., Beaverton, Oreg.

[21] Appl. No.: 633,872

[22] Filed: Dec. 26, 1990

[51] Int. Cl.⁵ .............................................. H03K 19/00
[52] U.S. Cl. .................................. 307/480; 307/455; 307/269
[58] Field of Search ............... 307/480, 455, 269, 228, 307/481, 362, 359, 181, 272.1, 260; 364/487; 315/367

[56] References Cited

U.S. PATENT DOCUMENTS

| | | | |
|---|---|---|---|
| 4,495,586 | 1/1985 | Andrews | 364/487 |
| 4,499,386 | 2/1985 | Schlotzhauer et al. | 307/260 |
| 4,797,572 | 1/1989 | Metz | 307/269 |
| 4,888,588 | 12/1989 | Castagnozzi | 341/122 |
| 4,982,118 | 1/1991 | Lloyd | 307/480 |
| 5,017,814 | 5/1991 | Lloyd | 307/480 |

Primary Examiner—Eugene R. LaRoche
Assistant Examiner—Ali Neyzari
Attorney, Agent, or Firm—Paul S. Angello; Boulden G. Griffith

[57] ABSTRACT

The present invention is a method and an electrical circuit (28 and 50) for effectively eliminating the effects of time jitter caused by metastable states by rejecting measurements made under timing conditions that could lead to the development of metastable states. In a preferred embodiment, the circuit of the invention effectively eliminates time jitter caused by metastable states in digital oscilloscope circuitry by determining in advance the timing conditions that can lead to such jitter and detecting whenever the transitions of trigger and trigger hold-off signals meet such timing conditions. The circuit then generates a "possible metastable" signal that can be used by the oscilloscope circuitry, or by the controlling software, to reject any measurement made under those timing conditions.

28 Claims, 6 Drawing Sheets

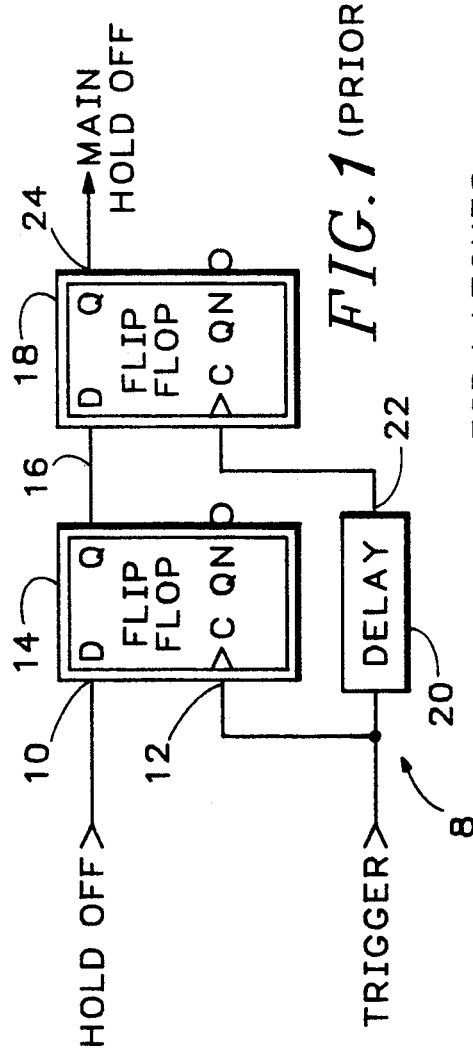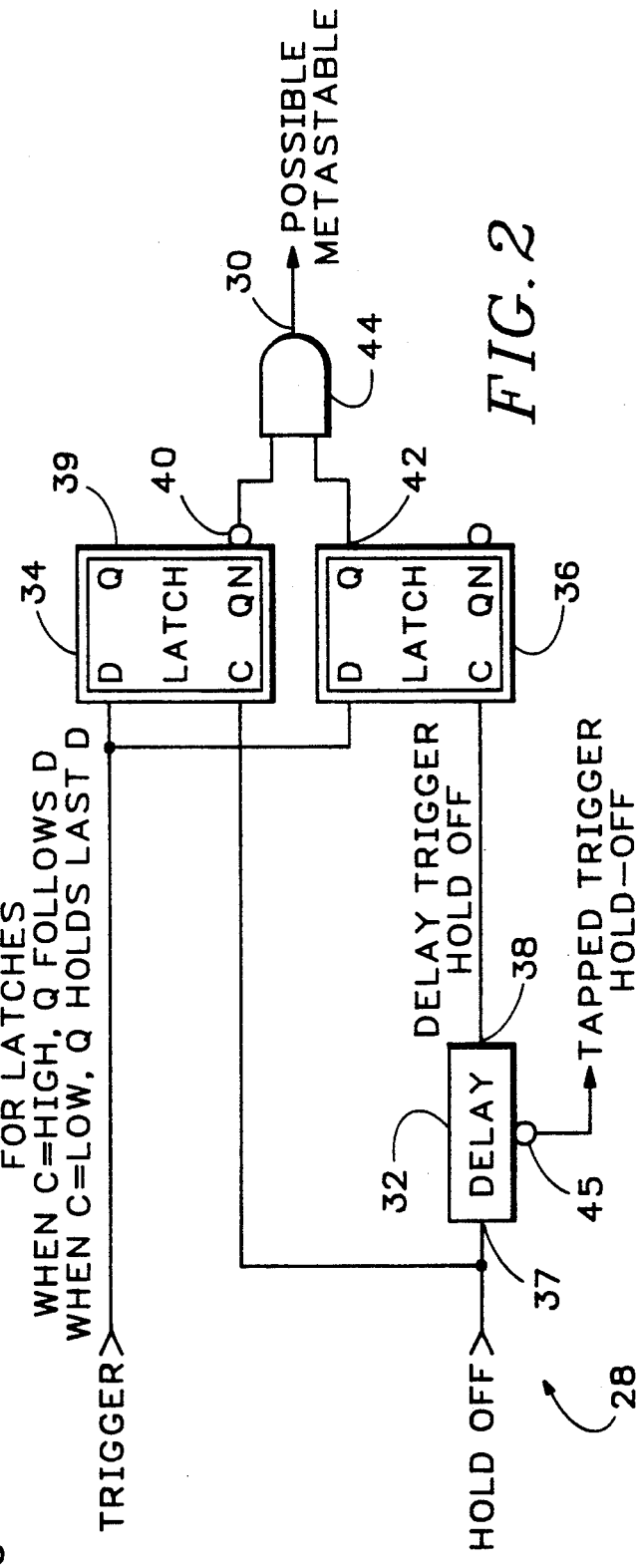

METHOD AND ELECTRICAL CIRCUIT FOR ELIMINATING TIME JITTER CAUSED BY METASTABLE CONDITIONS IN ASYNCHRONOUS LOGIC CIRCUITS

TECHNICAL FIELD

The present invention relates to high-speed digital measurement circuits, in particular, to a method and an electrical circuit for eliminating measurement errors caused by time jitter that results from metastable states in digital measurement circuits.

BACKGROUND OF THE INVENTION

Measurements made by high-speed oscilloscopes have suffered from time jitter caused by occurrences of metastable states in digital circuits. Time jitter occurs whenever an external signal being measured undergoes transitions from one state to another at times essentially coincident with internal oscilloscope signals undergoing transitions between logic states. This is true for external signals in either analog or digital form. Circuit designers have long known about such "race" conditions and have sought to avoid them by the use of synchronous circuit designs wherein all signals are derived from a common system clock, thereby eliminating coincidence of logic signal transitions.

Such "race" conditions can confuse logic circuits when, for example, two signals applied to different inputs of a flip-flop undergo nearly coincident changes between logic states and cause the output signal of the flip-flop to settle in an undefined state. The correct state often results, but the output signal may contain extraneous transitions until the circuit settles to its final logic state. It is also possible for the output signal to change to its final logic state following an unpredictable delay. Such unpredictable and untrustworthy signal states are called metastable states.

In measurement instruments such as oscilloscopes, it is impossible to ensure that externally applied signals being measured will be synchronous to the internal signals being used to make a measurement. A common example of such a pair of signals is the oscilloscope trigger and trigger hold-off signals. The trigger signal is commonly derived from an externally applied signal being measured and is, therefore, a completely arbitrary time-varying signal with unknown waveform characteristics. Once the oscilloscope is triggered, its internal circuitry generates various signals including the trigger hold-off signal. The trigger hold-off signal is used to prevent the generation of additional trigger signals until the current measurement being made is completed and the oscilloscope is ready to make another measurement. Time jitter may occur whenever the trigger hold-off signal changes logic states at about the same time a new trigger signal is received by the oscilloscope. The degree of coincidence that can cause time jitter is a time interval that can be determined from the known electrical characteristics of the logic circuits being driven by the trigger signal and trigger hold-off signal.

Previous art, such as dual synchronizer circuits, minimize the problem but do not eliminate trigger time jitter. The dual synchronizer circuit is used in a variety of oscilloscopes manufactured by Tektronix, Inc., Beaverton, Oreg., including its 11,000 series digital oscilloscopes.

FIG. 1, shows a prior art dual synchronizer circuit 8 that minimizes, but does not eliminate, metastable states in asynchronous logic circuits. Referring to FIG. 1, a hold-off signal and a trigger signal are applied to respectively a D (data) input 10 and a C (clock) input 12 of a first stage flip-flop 14. Whenever the trigger signal changes logic states in a positive-going direction, the signal logic state at D input 10 appears at Q output 16 of flip-flop 14. The signal at Q output 16 might be metastable if the trigger signal at input 12 changes logic stares in a positive-going direction at the same time that the hold-off signal at D input 10 changes logic states.

To minimize the possibility of metastable states, the D input of a second flip-flop 18 is coupled to Q output 16 of flip-flop 14. The clock input C of flip-flop 18 is coupled to the trigger signal through a time delay element 20. The time delay imparted to the trigger signal by delay element 20 exceeds the signal propagation delay through flip-flop 14. Delay element 20 can be implemented as a series of gates, a long piece of cable, or other means of delaying the propagation time of the trigger signal to the output 22 of delay element 20. The result is that flip-flop 18 receives as input signals the signal appearing on output 16 of flip-flop 14 and the delayed trigger pulses appearing on output 22 of delay element 20.

Dual synchronizer circuit 8 operates under the assumption that even if the signal on output 16 of flip-flop 14 is metastable, it will settle by the time delayed trigger signal output 22 of delay element 20 is applied to flip-flop 18. Therefore, the output 24 of second stage flip-flop 18 is assumed to be a reliable main hold-off signal. The problem with dual synchronizer 8 is that a small percentage of signals appearing on output 16 of first stage flip-flop 14 will take longer to settle than the delay imparted by delay element 20, or will settle to an incorrect logic state thereby rendering unreliable the signal on output 24 of second stage flip-flop 18.

A trigger resynchronization circuit described by Metz in U.S. Pat. No. 4,797,572 also minimizes but does not eliminate trigger time jitter. Metz describes a conventional trigger detecting circuit followed by delay and logic gate elements intended to eliminate all triggers except those in which the trigger signal and trigger hold-off signal are separated in time by an amount in excess of the delay element propagation time. The Metz circuit is another form of synchronizer circuit.

Trigger time jitter is particularly bothersome in high-speed digital sampling oscilloscopes because sampled measurement points may be stored and displayed at incorrect locations, thereby producing a cluttered display that remains until the entire display is cleared. Further, as oscilloscope measurement bandwidth increases, so does the need for increasing the triggering bandwidth, which must be equal to or greater than the measurement bandwidth. Increasing the triggering bandwidth increases susceptibility to time jitter-causing metastable conditions.

Thus, it has become more important to eliminate rather than just minimize metastable-caused time jitter conditions. Unfortunately, most circuit improvements that lead to reduced time jitter also ten to reduce the effective bandwidth of the logic circuits they are designed to protect from time jitter.

SUMMARY OF THE INVENTION

An object of the present invention is, therefore, to provide a method which will determine whether asynchronous signals have logic state transitions occurring within a predetermined time interval.

Another object of the present invention is to provide a method and circuit that produces a signal indicating whether such transitions nave occurred within the predetermined time interval.

A further object of this invention is to provide a method and circuit that use the indication signal to take corrective actions based on the assumption that metastable states may have occurred during the predetermined time interval.

The present invention provides a method and an electrical circuit for effectively eliminating the effects of time jitter by rejecting measurements made under conditions where metastable states may have caused time jitter. This invention is described by way of example only with reference to an oscilloscope, but can be adapted for use in other applications in which the jitter resulting from metastable states arises. The present method of the invention effectively eliminates time jitter caused by metastable states by determining in advance the timing conditions that can lead to such jitter, detecting whenever the transitions of a pair of signals meet those conditions, and then generating a "possible metastable" signal that can be used by the oscilloscope circuitry, or for controlling software, to reject any measurement made under those conditions.

In a preferred embodiment, the present invention is implemented as an electrical circuit in a digital oscilloscope that is designed to measure electronic signals. The signal being measured is typically used to generate the trigger signal. Once triggered, the oscilloscope generates an internal trigger hold-off signal that is used to inhibit additional trigger pulses for a preset amount of time. The present invention is used to detect trigger pulses that occur just as the trigger hold-off signal changes logic states and to take corrective action whenever such a condition occurs. The coincidence of a trigger signal and the trigger hold-off signal represents one condition that can cause metastable states leading to trigger time jitter.

Additional objects and advantages of the present invention will be apparent from the following detailed description of a preferred embodiment thereof that proceeds with reference to the accompanying drawings.

BRIEF DESCRIPTION OF THE DRAWINGS

FIG. 1 is a logic diagram of a prior art dual synchronizer circuit.

FIG. 2 is a simplified block diagram of a logic state transition detector circuit implemented as part of the invention.

DETAILED DESCRIPTION OF PREFERRED EMBODIMENTS

Figure 3:
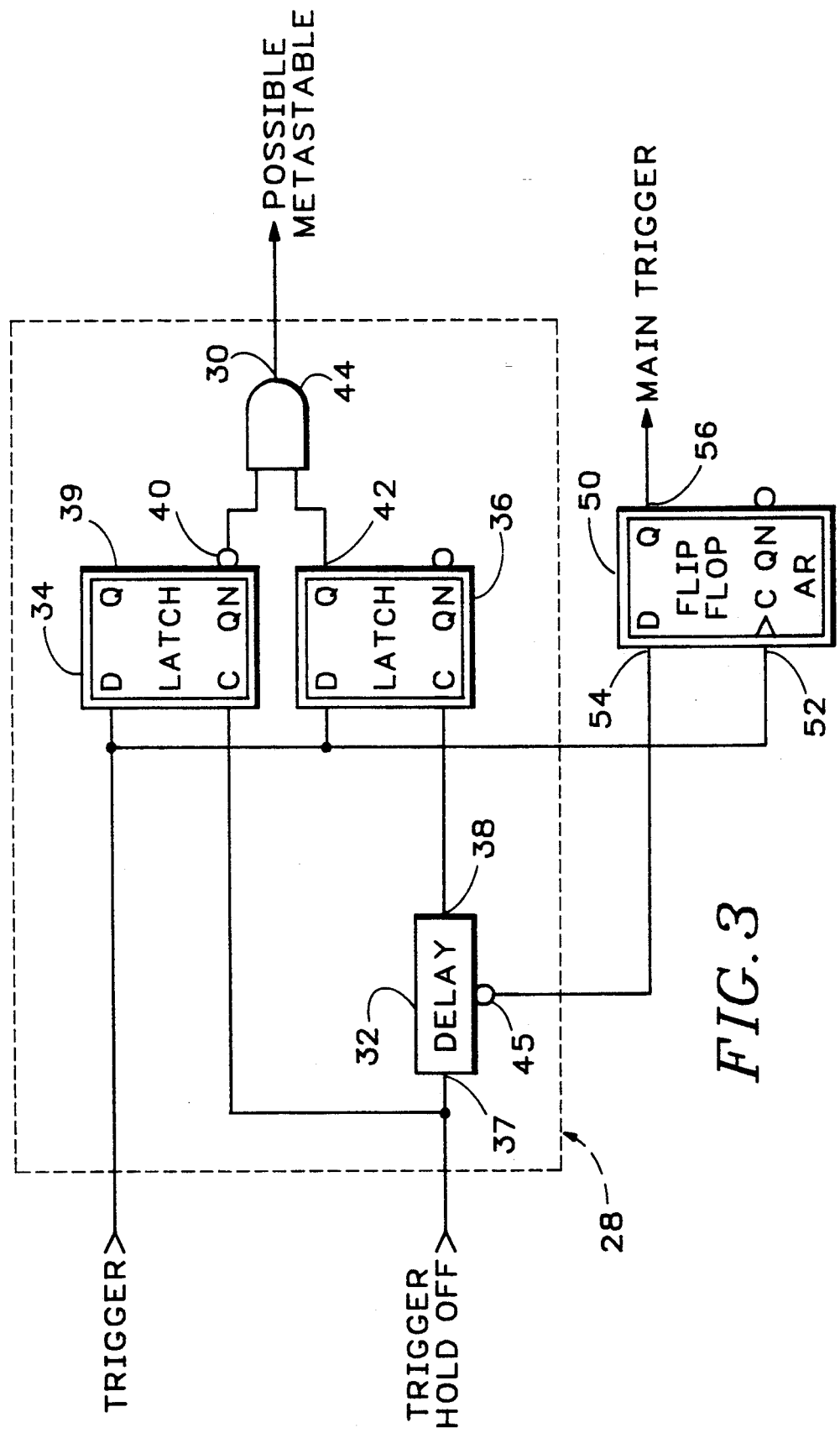
FIG. 3 is a simplified block diagram of a logic state transition detector circuit coupled to a trigger detecting flip-flop according to the invention.

FIG. 2 shows a simplified block diagram of a logic state transition detector 28 designed in accordance with the present invention. Transition detector 28 generates at its output terminal 30 a possible metastable signal whenever the trigger signal and the trigger hold-off signals change logic states within a time interval determined by delay element 32. Metastable states can occur whenever logic input signals change states within shorter time intervals than those specified by the manufacturers of the logic devices being driven. Logic devices have specification sheets that specify minimum setup and hold times for logic signals applied to their inputs. The present invention detects changes in logic states that violate the setup and hold time specifications required for metastable state-free operation of oscilloscope logic circuits. The time delay provided by delay element 32 is set to equal or exceed the setup and hold times required to satisfy the specifications of logic circuits to be driven by the trigger signal and the trigger hold-off signal.

Referring to FIG. 2, the trigger signal is electrically connected to the D (data) inputs of two storage elements, latch 34 and latch 36. The trigger hold-off signal is electrically connected to the C (clock) input of storage latch 34 and to the input 37 of delay element 32. A delayed trigger hold-off signal developed at output 38 of delay element 32 is electrically connected to the C input of storage latch 36. Storage latches 34 and 36 operate as follow-and-hold latches in the manner described below.

In general, whenever the C input is true (i.e., a logic 1 state), the Q output follows the logic state of the signal applied to the D input. Whenever the C input is false (i.e., a logic 0 state), the Q output holds the last logic state applied to the D input as C became false. Since the critical moment of timing in oscilloscope triggering circuits occurs just as the trigger hold-off signal changes from true to false, storage latch 34 will provide at its Q output 3 the state of the trigger signal just as the trigger hold-off signal goes false, and storage latch 36 will provide at its Q output 42 the state of the trigger signal just as the delayed hold-off signal on output 38 of delay element 32 goes false.

If Q outputs 39 and 42 of the respective storage latches 34 and 36 have the same logic states after the delayed trigger hold-off signal has gone false, then the trigger signal did not change states as the trigger hold-off signal propagated through delay element 32. If Q outputs 39 and 42 of the respective storage latches 34 and 36 have different logic states after the delayed trigger hold-off signal has gone false, then the trigger signal changed states during the time that the trigger hold-off signal propagated through delay element 32. That is, the trigger and trigger hold-off signals changed states in a coincident manner in which the degree of coincidence represented an amount of time up to the amount defined by the signal propagation time of delay element 32. The difference of the logic states stored by latches 34 and 36 is detected by electrically connecting the inverting QN output 40 of storage latch 34 and Q output 42 of storage latch 36 to different inputs of an AND gate 44. The output of AND gate 44 is the output terminal 30 of detector circuit 28 and provides the possible metastable signal.

Delay element 32 has an output tap 45 that provides a replica of the trigger hold-off input signal delayed by an amount of less than that of the signal on output 38. Tap 45 is centered on the delay element 32 in this example. In actual operation, the position of, i.e., the amount of delay of the signal on, tap 45 is determined by the setup and hold time requirements of the logic circuits with which the invention is implemented.

FIG. 3 is a block diagram of the logic state transition detector circuit 28 used in conjunction with a trigger signal detecting flip-flop 50. Trigger signal detecting flip-flop 50 has a clock C input 52 connected to the trigger signal and a data D input 54 connected to delay tap output 45 of delay element 32. Delay tap output 45 can be made to be either an inverting signal or a non-inverting signal, depending upon the requirements of the logic circuit being driven. In the case of trigger detecting flip-flop 50, its data D input 54 should be true when the trigger hold-off signal is false, thereby requiring an inversion of the logic signal at tap 45 of delay element 32. A technique for achieving the logic inversion, as well as delay time and tap requirements for delay element 32, will be more fully described below.

For purposes of illustration, delay element 32 provides a 0.200 nanosecond delay with tap 45 at the center point of the delay element. If the trigger hold-off signal goes false at a time zero, delay tap 45 will go true after 0.100 nanoseconds, thereby setting data D input 54 of trigger detecting flip-flop 50 true to enable flip-flop 50. Then if the trigger signal goes true at a time greater than 0.200 nanoseconds after time zero, the Q output 56 of trigger detecting flip-flop 50 will change logic states after the time in which the logic state transition detector 28 would have operated and therefore no possible metastable signal is generated at transition detector output 30.

If, however, the trigger signal goes true 0.150 nanoseconds after time zero, the Q output 56 of trigger detecting flip-flop 50 will change logic states within the time during which the logic state transition detector 28 can operate, and a possible metastable signal will be generated at transition detector output 30.

If the trigger signal goes true 0.050 nanoseconds after time zero, trigger detecting flip-flop 50 will change states prior to the arrival of the tapped trigger hold-off signal at the data D input 54 of trigger detecting flip-flop 50. This occurs within the operating time window of the logic state transition detector 28 as determined by delay element 32, and a possible metastable signal is generated at transition detector output 30.

The above three examples indicate that trigger detecting flip-flop 50 changes logic states without an accompanying possible metastable signal only under the conditions in which clock C input 52 detects a trigger signal that occurs at a time greater than 0.100 nanoseconds plus the setup time of latch 34 plus the hold time of latch 36 from the time when the tapped trigger hold-off signal at delay element 32 tap 45 goes true.

If the propagation delay time of delay element 32 is made sufficiently long to account for the setup and hold times of storage latches 34 and 36 and of trigger detecting flip-flop 50, flip-flop 50 will be free of metastable triggering conditions whenever the trigger signal and trigger hold-off signals change states at time differences greater than the propagation time of the trigger hold-off signal through delay element 32. The Q output 56 of trigger detecting flip-flop 50 is representative of the main trigger signal as it is normally used in an oscilloscope.

Figure 4:
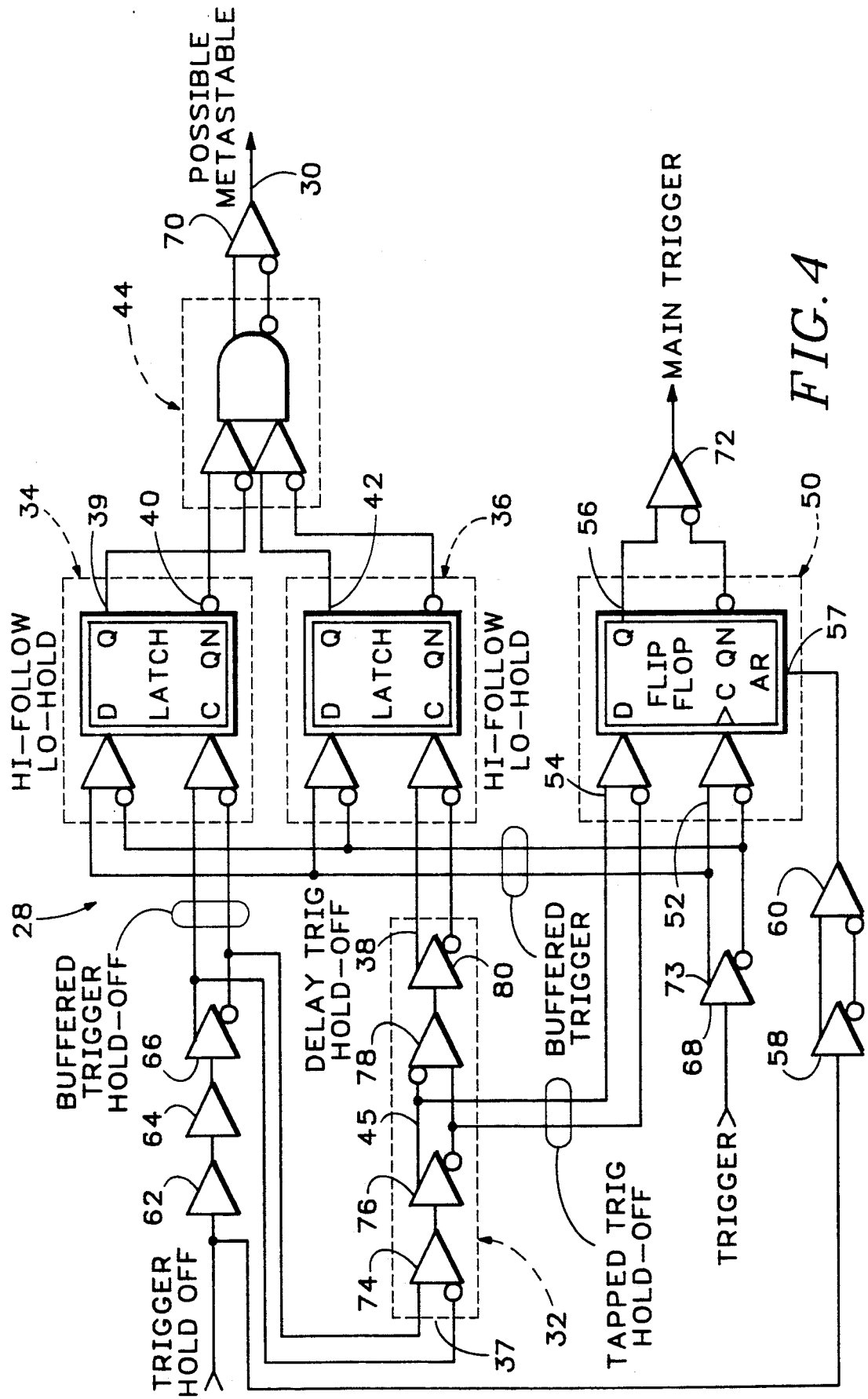
FIG. 4 is a logic diagram of the logic state transition detector and trigger logic circuit according to the invention.
Figure 5A:
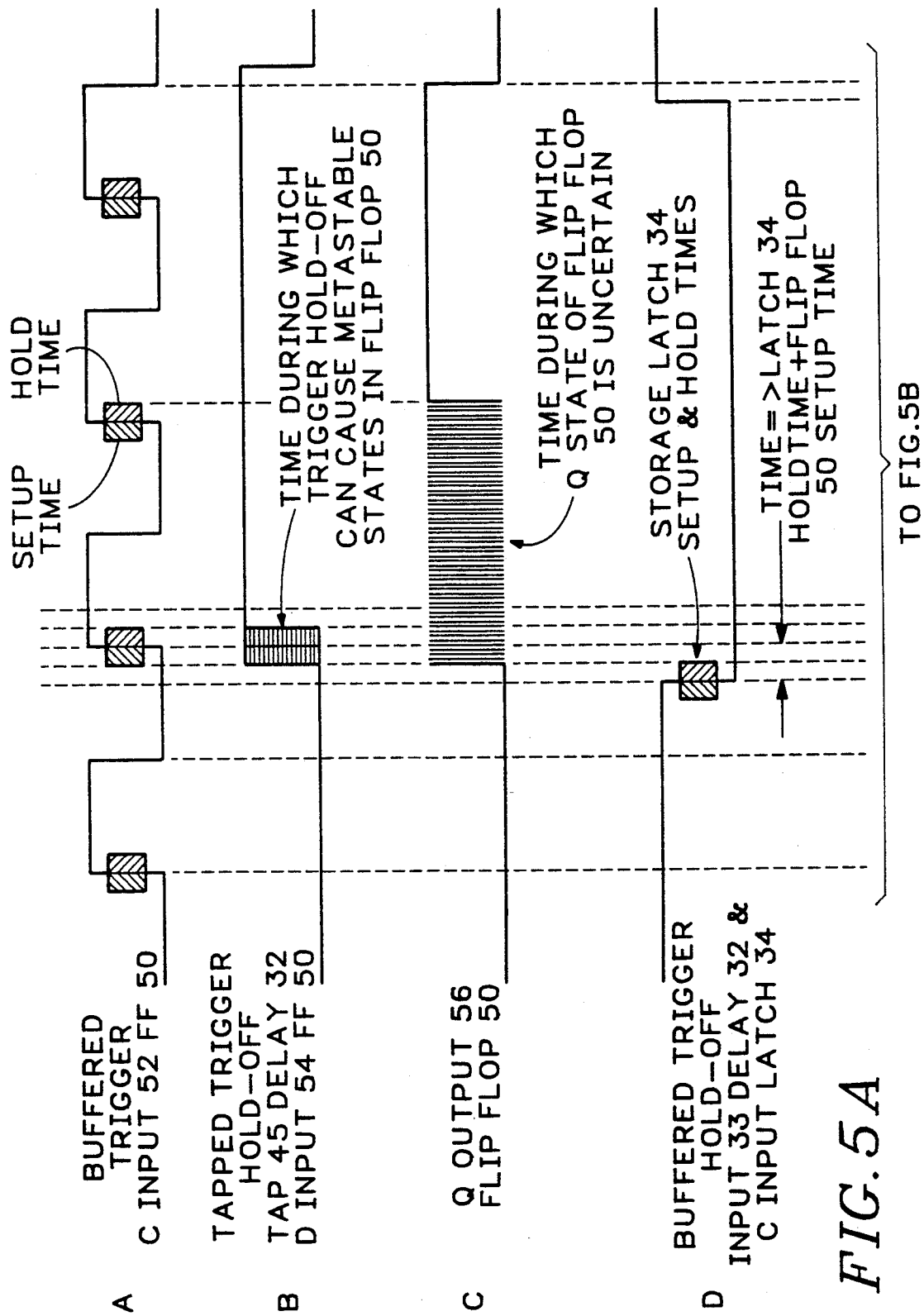
FIG. 5 is a timing diagram for explaining the operation of the circuit according to the invention.
Figure 5B:
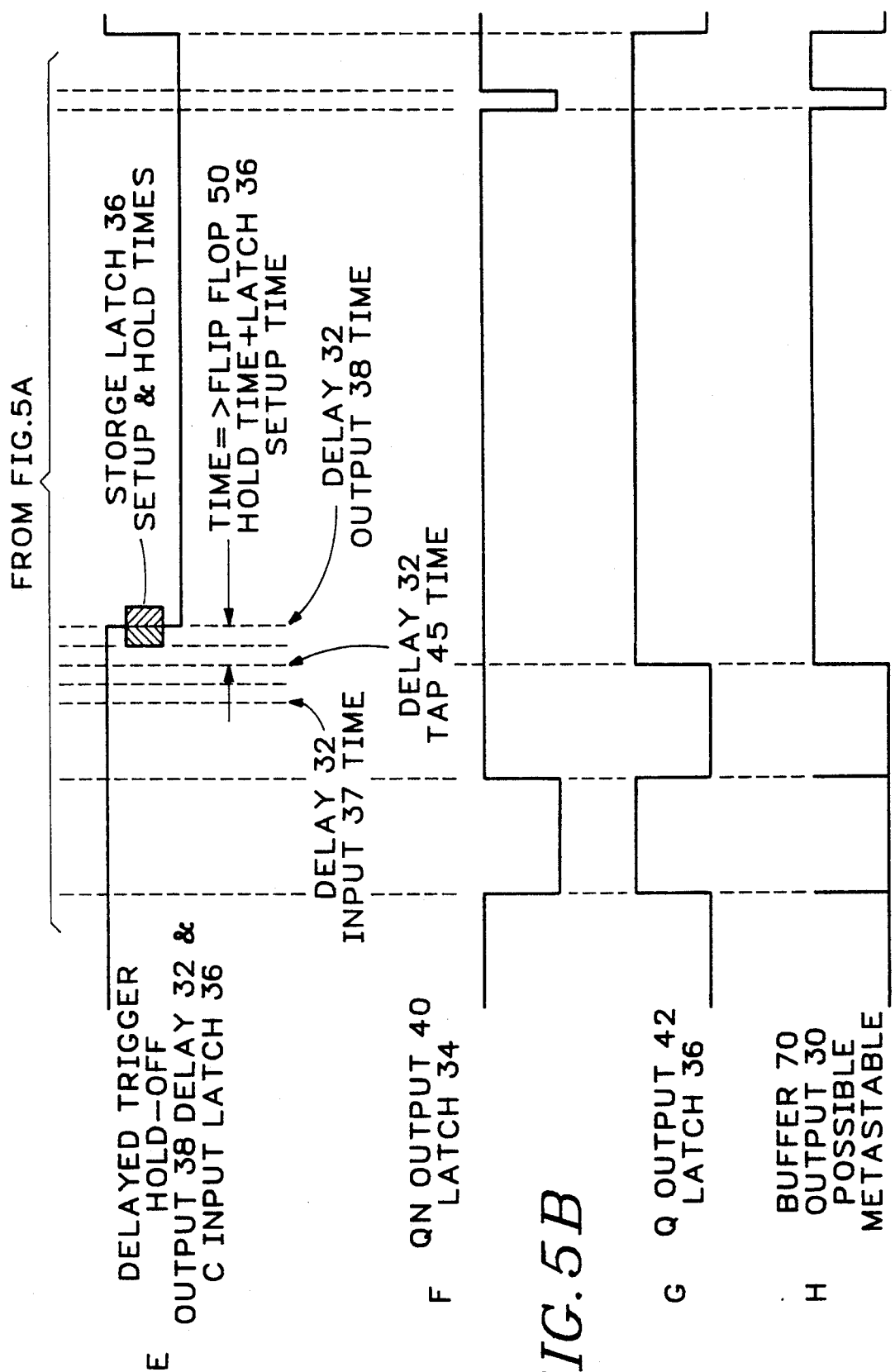

FIG. 4 shows in greater detail the preferred embodiment of the present invention as it is used in an oscilloscope. The logic circuits are implemented using an emitter-coupled logic (ECL) gate array such as the Q3500 series of arrays available from Applied Micro Circuits Corporation (AMCC). San Diego, Calif. One skilled in the art would appreciate that arrays from different manufacturers, discrete logic chips, or other logic forms such as TTL could also be used, either alone or in combination, to implement the invention. Only the performance parameters of the resulting circuit would change without altering the novelty or utility of the invention. Corresponding changes in the amount of propagation delay through delay element 32 would be necessary to account for the differing setup and hold time specifications inherent in different logic device families.

Referring to FIG. 4, the trigger hold-off signal passes through buffer logic elements 58 and 60 and is electrically connected to reset input 57 of trigger detecting flip-flop 50. The buffers are used to decrease loading of the trigger hold-off signal. The Q output 56 of trigger detecting flip-flop 50 is held false as long as the trigger hold-off signal is true. The trigger hold-off signal is delayed by the propagation delay of buffers 58 and 60 prior to being asserted at reset input 57 of trigger detecting flip-flop 50. To compensate for the delay through buffers 58 and 60, buffers 62, 64, and 66 delay the trigger hold-off signal by a time greater than the delay of buffers 58 and 60 before the buffered trigger hold-off signal is asserted at the clock input C of storage latch 34 and input 37 of delay 32. The delay introduced by buffers 62, 64, and 66 ensures that the reset signal will be false at trigger detecting flip-flop 50 before the buffered trigger signal can be true at the clock C input 52 of trigger detecting flip-flop 50 by the manufacturer specified reset release time of trigger detecting flip-flop 50.

In FIG. 4, many of the logic signal conductors are implemented as differential pairs. In ECL logic such as that found in the AMCC Q3500 series, the use of differential pairs increases the speed of the logic and improves the noise rejection of the circuitry. Signals may be inverted in logic sense by simply exchanging connections at one end of a differential pair or the other. For example, this is done to the buffered trigger hold-off signal at the input to delay element 32 to provide the necessary signal inversion at delay tap 45. The trigger signal drives buffer 68 and is then electrically connected, as a non-inverted signal, to the data D inputs of storage latches 34 and 36 and to the clock input C 52 of trigger detecting flip-flop 50.

The logic state transition detector 28 is made up of storage latches 34 and 36, delay element 32, AND gate 44, and buffer 70. Delay element 32 is implemented by cascading logic buffers 74, 76, 78, and 80. A logic signal inversion at the input to buffer 78 compensates for an earlier one at the input 37 of delay element 32 and provides a signal of the proper polarity at the clock input C of storage latch 36. The inputs to AND gate 44 are QN output 40 of storage latch 34 and Q output 42 of storage latch 36. The output of AND gate 44 is electrically connected to buffer 70. The output 30 of buffer 70 provides the possible metastable signal.

Trigger detecting flip-flop 50 operates in essentially the same manner as was described with reference to FIG. 3. The buffered trigger signal provided at output 73 of buffer 68 is electrically connected to the clock input C of trigger detecting flip-flop 50, and the delayed hold-off signal provided at delay element 32 tap 45 is electrically connected to the data input D of trigger detecting flip-flop 50. The Q and QN outputs of flip-flop 50 are electrically connected to buffer 72, the output of which is the main trigger signal.

FIGS. 5A-5H show the timing relationships of certain key signals developed by the invention. The buffered trigger signal (line A) drives clock C input 52 of flip-flop 50, data input D of storage latch 34, and data input D of storage latch 36. The setup and hold times for flip-flop 50 are indicated on the timing diagram by the width of shaped areas on the rising edges of the buffered trigger waveform (line A).

The tapped trigger hold-off signal (line B) is shown as it drives data input D 54 of flip-flop 50. The shaded portion of the rising edge of this waveform indicates the time region in which the tapped trigger hold-off signal violates the setup and hold times of flip-flop 50 with respect to the buffered trigger signal (line A) being applied to C input 54 of flip-flop 50.

The waveform for Q output 56 (line C) of flip-flop 50 indicates the time region in which the logic state may be uncertain because of the possibility of metastable states in flip-flop 50.

The buffered hold-off signal (line D) drives the clock input C of storage latch 34 and input 37 of delay element 32. The setup and hold times of storage latch 34 are shown as a shaded region on the waveform. The amount of delay required through delay element 32 from input 37 to delay tap 45 is equal to or greater than the hold time of storage latch 34 plus the setup time of flip-flop 50.

The delayed hold-off signal (line E) drives the clock input C of storage latch 36. The time delay from the tap 45 of delay element 32 to output 38 of delay element 32 is equal to or greater than the hold time of flip-flop 50 plus the setup time of storage latch 36. The setup and hold times of storage latch 36 are shown by the shaded region on the waveform.

When the timing conditions described above are met, the circuit will operate properly and will ensure that only one of the three elements, storage latch 34, storage latch 36, or flip-flop 50, can be metastable at a time. The remaining three signals, QN output 40 of storage latch 34 (line F), Q output 42 of storage latch 36 (line G), and output 30 of buffer 70 (line H) are shown in their normal operating relationships with the signals previously described. Line H represents the possible metastable signal.

The logic state transition detector 28 and trigger detecting flip-flop 50 circuits described above are used in a digital sampling oscilloscope in the manner described below.

Figure 6:
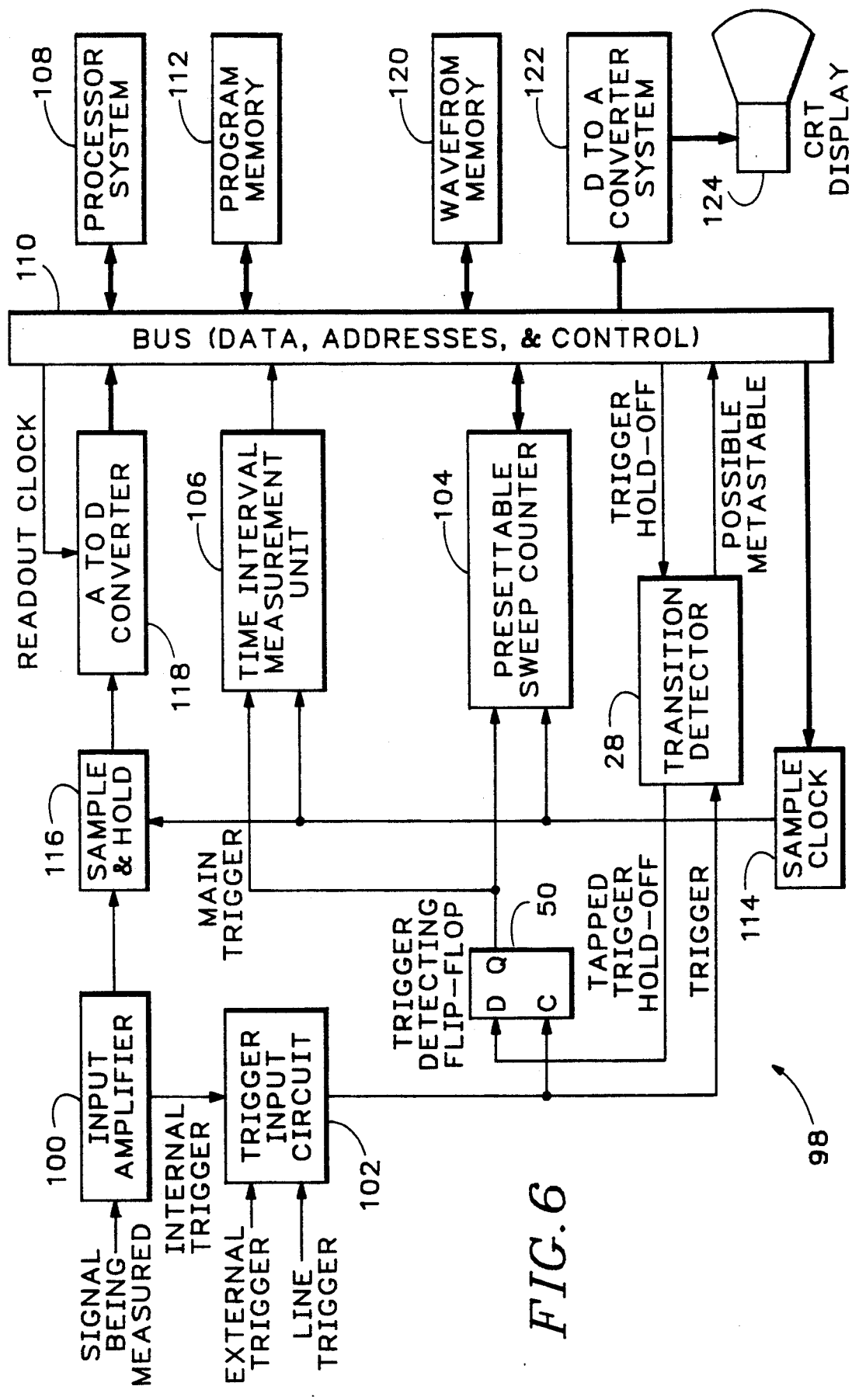
FIG. 6 is a simplified block diagram of a digital sampling oscilloscope utilizing the invention.

FIG. 6 is a simplified block diagram of a digital sampling oscilloscope 98 that incorporates the invention. An external signal to be measured by the oscilloscope is connected to an input amplifier 100 and further coupled to a trigger input circuit 102. Trigger input circuit 102 is coupled to trigger detecting flip-flop 50 and transition detector 28. Normally the signal to be measured is repetitive and will produce a trigger signal for each waveform cycle. Trigger flip-flop 50 develops the main trigger signal which drives a presettable sweep counter 104 and a time interval measurement unit 106. Presettable sweep counter 104 provides a signal to a processor 108 via a bus 110 to begin execution of a program, stored in a program memory 112, that causes the waveform to be sampled. The trigger hold-off signal is asserted on bus 110 at the same time. Processor 108 starts sample clock 114 which causes a sample-and-hold circuit 116 to sample pieces of the waveform for digitizing by analog-to-digital converter 118. As the waveform is digitized, data representing the waveform amplitude are placed into a waveform memory 120 at address locations related to the equivalent time of each sample taken of the waveform as determined by time interval measurement unit 106. Waveform memory 120 is repetitively read out through a digital-to-analog converter system 122 and displayed on a cathode-ray tube display 124.

The oscilloscope digitizing process is sufficiently fast to sample numerous points on the waveform for each oscilloscope sweep. With numerous sweeps, the displayed waveform quickly builds to appear as a continuous solid waveform on cathode-ray tube display 124. During each sweep, the trigger hold-off signal is true, thereby preventing additional trigger signals from restarting the sweep prematurely. As soon as the sweep is completed, as determined by presettable sweep counter 104, the trigger hold-off signal changes to a false condition. If a new trigger signal occurs just as the trigger hold-off signal becomes false, time interval measurement unit 106 may be started erroneously by the main trigger signal because of metastable states generated in the trigger detecting flip-flop 50. The resulting timing error would cause waveform point samples digitized during the ensuing sweep to be stored in memory at improper equivalent time locations in waveform memory 120, thereby giving the displayed waveform the appearance of jittering.

Under the circumstances just described, the circuit of the present invention would generate a possible metastable signal that oscilloscope 98 would use to reject waveform samples digitized during sweeps with questionable timing. The rejection can be accomplished in many ways, but the preferred method uses the possible metastable signal to set a flag that processor system 108 uses under control of programs stored in program memory 112 that control the oscilloscope digitizer system. The flag interrupts the digitizing process described above and causes storage of digitized waveform points in memory to cease until a main trigger signal is received for which the possible metastable signal stays false.

The application of the method for eliminating jitter caused by metastable conditions in asynchronous circuits has application in many other electronic circuits as well. In oscilloscopes it is used for trigger detecting circuits, as described above, and for delayed trigger timers where the time delay is arbitrary. Applications in which asynchronous signals are being used and in which errors, timing confusion, dropped signals, or other anomalies can occur because of metastable states, are candidate applications for this invention as one skilled in the art can appreciate. Such applications can include multi-port memory controllers, digital word trigger detectors, signal acquisition systems, and human interface device couplers. The scope of the present invention should, therefore, be determined only by the following claims.

What is claimed is:

1. A method for detecting conditions leading to metastable states in a digital circuit, comprising:
receiving first storing in a first storage element information indicative of a predetermined first state of the first signal before an occurrence of a predetermined transition of the second signal and second storing in a second storage element information indicative of a predetermined transition of the first signal from the first state to a second state during a predetermined time interval following the predetermined transition of the second signal; and developing a possible metastable signal indicative of a possible metastable state resulting from an occurrence of predetermined transitions of the first and second signals within the predetermined time interval from the information stored in the first and second storage elements.

2. The method of claim 1 further comprising:
processing the first and second signals to produce a result; and
preventing reliance on the result in response to the possible metastable signal.

3. The method of claim 1 in which each of the first and second storage elements includes a level-triggered storage latch.

4. The method of claim 1 in which the predetermined time interval is represented by the propagation time imparted to the second signal passing through a series of logic elements.

5. The method of claim 1 in which the predetermined time interval is represented by the second signal propagation time through a delay line.

6. The method of claim 2 in which the digital circuit is implemented in an oscilloscope that produces a trigger hold-off signal and that includes a processor to process signal data acquired during a sweep initiated by a trigger signal, the trigger signal and the trigger hold-off signal representing the respective first and second asynchronous time-varying signals, the step of preventing reliance on the result, comprising:
signaling the processor to ignore signal data acquired during a sweep in which a possible metastable signal is developed.

7. The method of claim 2 in which the digital circuit is implemented in an oscilloscope that produces a trigger hold-off signal and that includes a processor to process signal data acquired during a sweep initiated by a trigger signal, the trigger signal and the trigger hold-off signal representing the respective first and second asynchronous time-varying signals that are processed to produce a main trigger signal, the step of preventing reliance on the result, comprising:
using logic elements electrically connected to the possible metastable signal to inhibit the action of the main trigger signal.

8. The method of claim 2 in which the digital circuit is implemented in an oscilloscope that produces a trigger hold-off signal and that includes a processor to process signal data acquired during a sweep initiated by a trigger signal, the trigger signal and the trigger hold-off signal representing the respective first and second asynchronous time-varying signals, the step of preventing reliance on the result, comprising:
signaling the processor to inhibit storage of signal data acquired during a sweep in which a possible metastable signal is developed.

9. The method of claim 8 in which the first signal constitutes a trigger signal and the second signal constitutes a trigger hold-off signal.

10. The method of claim 2 in which the digital circuit is implemented in an oscilloscope that produces a trigger hold-off signal and that includes a processor to process signal data acquired during a sweep initiated by a trigger signal, the trigger signal and the trigger hold-off signal representing the respective first and second asynchronous time-varying signals and the result constituting the production of a main trigger signal, the step of processing the first and second signals to produce the result, comprising:

providing a logic element with first and second inputs:
driving the first input of a logic element with the trigger signal;
driving the second input of the logic element with the trigger hold-off signal delayed by less than the predetermined time interval; and
processing the signals at the first and second inputs of the logic element to develop the main trigger signal.

11. A method for avoiding erroneous results caused by metastable states in a digital oscilloscope circuit, comprising:
receiving trigger and trigger hold-off asynchronous time-varying signals, each of which having transitions between two states;
processing the trigger and trigger hold-off signals to produce a main trigger signal;
storing in a first storage element information indicative of a predetermined first state of the trigger signal before an occurrence of a predetermined transition of the trigger hold-off signal;
storing in a second storage element information indicative of a predetermined transition of the trigger signal from the first state to a second state during a predetermined time interval following the predetermined transition of the trigger hold-off signal;
developing from the information stored in the first and second storage elements a possible metastable signal indicating whether the predetermined transitions of the trigger and trigger hold-off signals occurred within the predetermined time interval; and
preventing reliance on the main trigger signal in response to the possible metastable signal.

12. Apparatus for avoiding erroneous results caused by metastable states in a digital oscilloscope circuit, comprising:
trigger means for receiving a trigger signal having transitions between two states;
trigger hold-off means for receiving a trigger hold-off signal having transitions between two states, the trigger hold-off signal being asynchronous to the trigger signal;
main trigger signal means responsive to the trigger and trigger hold-off signals to produce a main trigger signal;
first storage means for storing information indicative of a predetermined first state of the trigger signal at the time before a predetermined transition of the trigger hold-off signal;
second storage means for storing information indicative of a transition of the trigger signal to a second state during a predetermined time interval following the predetermined transition of the trigger hold-off signal;
possible metastable signal means for developing a possible metastable signal responsive to information in the first and second storage means, the possible metastable signal indicating whether predetermined transitions of the trigger and trigger hold-off signals occurred within the predetermined time interval; and
processing means using the possible metastable signal for preventing reliance on the main trigger signal.

13. The apparatus of claim 12 in which each of the first and second storage means includes a level-triggered storage latch.

14. The apparatus of claim 12 in which the predetermined time interval is represented by the propagation time imparted to the trigger hold-off signal passing through a series of logic elements.

15. The apparatus of claim 12 in which the predetermined time interval is represented by the propagation time of the trigger hold-off signal through a delay line.

16. The apparatus of claim 12 in which the possible metastable signal means includes an AND gate for comparing the contents of the first and second storage means and for generating the possible metastable signal whenever the trigger signal states stored in the first and second storage means differ.

17. The apparatus of claim 12 in which the main trigger signal means includes a flip flop that comprises a clock input responsive to the trigger signal, a data input responsive to the trigger hold-off signal delayed by less than the predetermined time interval, and output means for generating the main trigger signal.

18. The apparatus of claim 12 in which the processing means includes a microprocessor responsive to the possible metastable signal for preventing reliance on the main trigger signal.

19. The apparatus of claim 12 in which the processing means includes logic elements responsive to the possible metastable signal for preventing reliance on the main trigger signal.

20. Apparatus for detecting conditions leading to metastable states in a digital circuit, comprising:
   means for receiving first and second time-varying signals each having transitions between two states, the second signal being asynchronous to the first signal;
   first storage means for storing information indicative of a predetermined first state of the first signal at the time before a predetermined transition of the second signal;
   second storage means for storing information indicative of a transition of the first signal to a second state during a predetermined time interval following the predetermined transition of the second signal;
   possible metastable signal means for developing a possible metastable signal responsive to information in the first and second storage means, the possible metastable signal indicating whether predetermined transitions of the first and second signals occurred within the predetermined time interval.

21. The apparatus of claim 20 further comprising:
   means responsive to the first and second signals to produce a third signal; and
   processing means for using the possible metastable signal to prevent reliance on the third signal.

22. The apparatus of claim 20 in which each of the first and second storage means includes a level-triggered storage latch.

23. The apparatus of claim 20 in which the predetermined time interval is represented by the propagation time imparted to the second signal passing through a series of logic elements.

24. The apparatus of claim 20 in which the predetermined time interval is represented by the propagation time of the second signal through a delay line.

25. The apparatus of claim 20 in which the possible metastable signal means includes AND gate means for comparing the contents of the first and second storage means to generate the possible metastable signal whenever the first signal states stored in the first and second storage means differ.

26. The apparatus of claim 20 in which the third signal means includes a flip flop that comprises a clock input responsive to the first signal, a data input responsive to the second signal delayed by less than the predetermined time interval, and output means for generating the third signal.

27. The apparatus of claim 20 in which the processing means includes a microprocessor responsive to the possible metastable signal for inhibiting responses to the third signal.

28. The apparatus of claim 20 in which the processing means includes logic elements responsive to the possible metastable signal for preventing reliance on the third signal.

* * * * *